(12) United States Patent
Nowka

(10) Patent No.: US 6,288,572 B1
(45) Date of Patent: Sep. 11, 2001

(54) METHOD AND APPARATUS FOR REDUCING LEAKAGE IN DYNAMIC SILICON-ON-INSULATOR LOGIC CIRCUITS

(75) Inventor: Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/629,133

(22) Filed: Jul. 31, 2000

(51) Int. Cl.[7] .................. H03K 19/003; H03K 19/096
(52) U.S. Cl. .................. 326/98; 326/14; 326/15; 326/95; 327/427; 327/534; 327/566
(58) Field of Search .................. 326/14, 15, 93, 326/95, 98; 327/427, 534, 566

(56) References Cited

U.S. PATENT DOCUMENTS

| | | | |
|---|---|---|---|
| 6,049,230 | * 4/2000 | Durham et al. | 326/98 |
| 6,094,072 | * 7/2000 | Davies et al. | 326/98 |
| 6,150,834 | * 11/2000 | Ciraula et al. | 326/21 |
| 6,150,869 | * 11/2000 | Storino et al. | 327/534 |
| 6,163,173 | * 12/2000 | Storino et al. | 326/98 |
| 6,188,247 | * 2/2001 | Storino et al. | 326/98 |

* cited by examiner

Primary Examiner—Michael Tokar
Assistant Examiner—Vibol Tan
(74) Attorney, Agent, or Firm—Casimer K. Salys; Bracewell & Patterson, L.L.P.

(57) ABSTRACT

A method and apparatus for reducing leakage in dynamic Silicon-On-Insulator (SOI) logic circuits improves the performance of dynamic gates implemented in SOI technology. A bias generator is used to create a negative potential by using the pre-charge input signal to bootstrap a bulk capacitor charging circuit, shifting a positively charged bulk capacitor terminal to ground, causing a negative potential at the other terminal. A bias control circuit applies this negative potential to intermediate nodes of logic input ladders of a dynamic logic gate to reduce leakage and threshold lowering effects due to the voltage variation on the bodies of logic input transistors implemented in SOI logic.

20 Claims, 4 Drawing Sheets

METHOD AND APPARATUS FOR REDUCING LEAKAGE IN DYNAMIC SILICON-ON-INSULATOR LOGIC CIRCUITS

BACKGROUND OF THE INVENTION

1. Technical Field

The present invention relates to digital integrated circuits, and more particularly to dynamic logic circuits implemented in Silicon-On-Insulator (SOI) technology with enhancements that reduce leakage current within the circuits.

2. Description of the Related Art

Dynamic logic circuits are widely used in integrated circuit designs, especially in Very Large Scale Integrated (VLSI) circuit designs. Because dynamic logic circuits use comparably fewer transistors per circuit block than static logic circuits, dynamic logic circuits have relatively higher circuit densities and are very desirable for use in VLSI circuits such as microprocessors and memories.

Complementary Metal Oxide Semiconductor (CMOS) technology has been the technology of choice for low power designs, because the bulk of the power dissipation in CMOS circuits occurs when the transistors are switching. This characteristic has made CMOS implementations preferable for low power static designs. CMOS static circuits use P-channel and N-channel MOS devices in a complementary configuration to form logic gates.

Dynamic circuits are typically not complementary designs, as the P-channel devices and the N-channel devices are used to perform different functions within a logic gate. For example a p-channel transistor is used to pre-charge an evaluation node, and an n-channel transistor is used to discharge the node in response to logic inputs.

Silicon-On-Insulator (SOI) technology is a relatively new technology having enhanced low power characteristics, which makes it ideal for implementing low power dynamic gates. Additionally, SOI technology has less parasitic substrate capacitance, which leads to a higher switching speed for transistors implemented in SOI. Rather than embedding the channel material in a semiconductor substrate, SOI fabrication technology forms channel material on top of an oxide layer, decreasing leakage resistance and parasitic capacitance. SOI devices are isolated by Shallow Trench Insulation (STI), rather than the substrate, which further reduces capacitive effects and noise coupling from other devices.

There is a drawback associated with transistors formed in SOI technology, however. A parasitic bipolar transistor exists in both non-insulated MOS implementations and the SOI implementation. The bipolar transistor has an emitter and collector formed by the doped regions at the two ends of the channel (N+ material for an N-channel MOS transistor). The base of the transistor is formed by the substrate. In non-insulated MOS technology, the substrate is typically biased so that the transistor will always be off. For N-channel material, this bias is accomplished by connecting the substrate to the lowest negative potential in the circuit. In SOI implementations, because the channel material is deposited on an insulator, the body of the MOS transistor has no electrical connection. This is known as the "floating-body effect," and can cause malfunction of dynamic gates implemented in SOI technology. The floating-body effect causes pre-charge leakage by lowering the threshold of the transistors in logic input ladders, since the body of the transistor contributes to the overall field in the channel of the transistor. The floating-body effect decreases the noise immunity of a dynamic logic gate, as well as increasing the sensitivity to coupling from other input signals and sub-threshold variations in voltages at the gate's logic inputs. The floating-body effect can be overcome by "contacting" the body by connecting the body to an appropriate power supply potential, but this increases the capacitance of the device and the contact itself contributes a resistor-capacitor (RC) time constant due to the resistance of the contact.

It would therefore be desirable to implement dynamic logic circuits in such a way that the floating-body effect can be reduced or eliminated.

SUMMARY OF THE INVENTION

The objective of reducing the leakage and threshold lowering in Silicon-On-Insulator (SOI) dynamic logic gates is accomplished in a dynamic logic gate that includes a pre-charge transistor, one or more logic ladders having multiple logic inputs, a bias generator for generating a negative bias and a bias control for applying a bias generator output to intermediate nodes of the logic ladders when a pre-charge signal is active. The bias generator may be driven by the pre-charge input signal by using a delayed bootstrap circuit that charges a capacitor and shifts the level at the positively charged capacitor terminal to ground. The bootstrap circuit produces a negative potential at the other terminal that can be applied as a negative bias to the logic ladders.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1A:
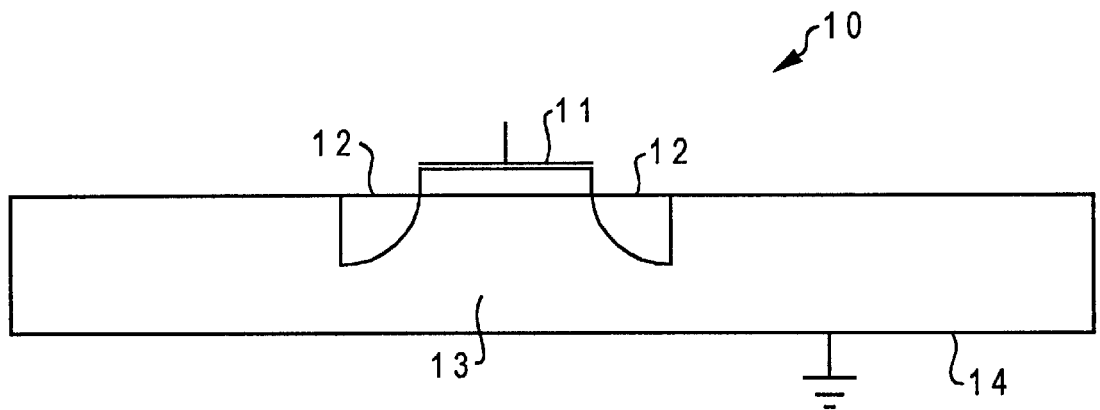
FIG. 1A is a pictorial diagram depicting the structure of a MOS transistor formed on a semiconductor substrate.

With reference now to the figures and in particular with reference to FIG. 1A, there is depicted a Metal Oxide Semiconductor (MOS) transistor 10 on a semiconductor substrate 14. The doped regions 12 provide conduction barriers when the potential on a gate 11 is such that no field is developed in a channel 13. Substrate 14 is connected to the point of lowest potential in the circuit (in this case ground). This substrate connection serves as a bias that holds substrate 14 at ground potential.

Figure 1B:
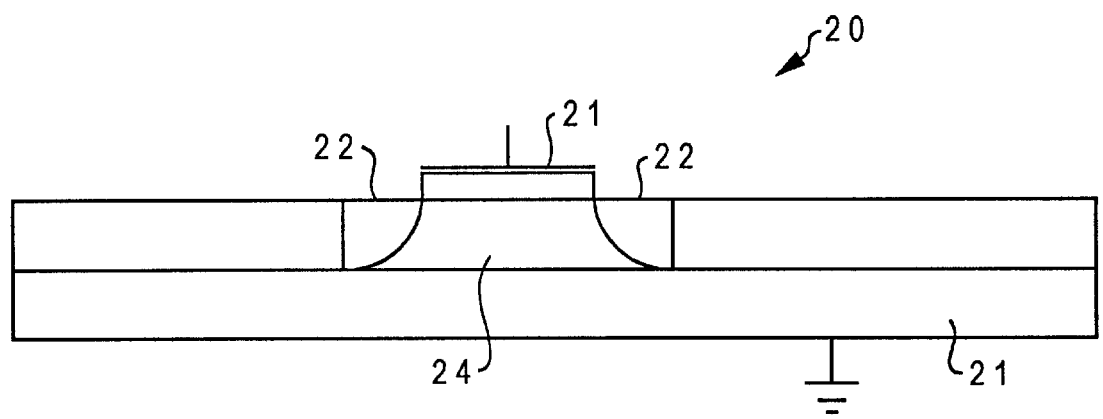
FIG. 1B is a pictorial diagram depicting the structure of a MOS transistor formed on an insulating substrate.

Referring now to FIG. 1B, there is depicted a MOS transistor 20, formed on an insulating substrate 21. Since there is no bias connection to the underside of channel 24, the channel material or "body" electrically "floats". This produces the floating-body effect. Charge can accumulate on channel 24, affecting the field within channel 24 so that leakage is increased and the threshold lowered.

Figure 2:
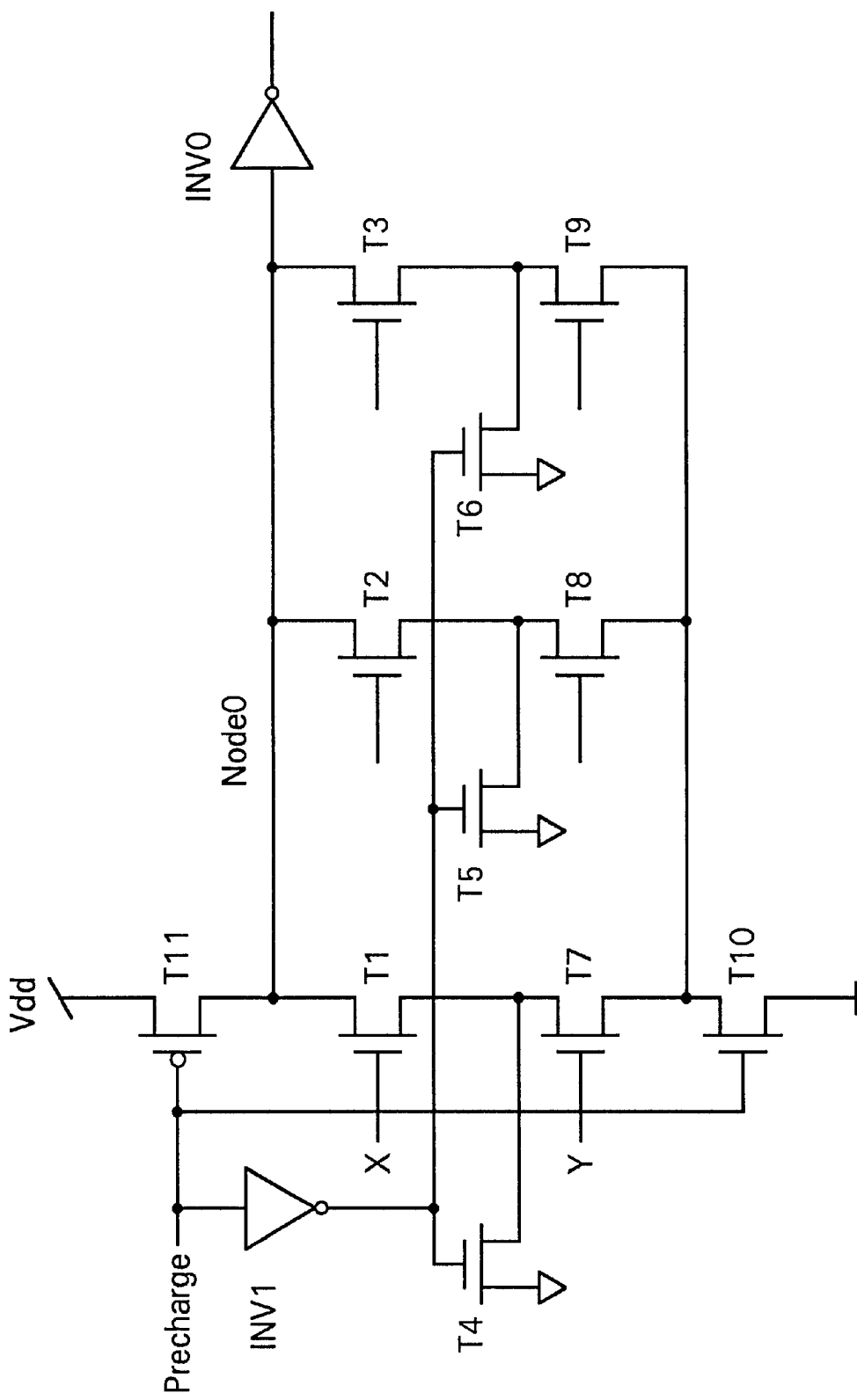
FIG. 2 is a schematic diagram of a prior art dynamic logic circuit.

Referring now to FIG. 2, a prior art dynamic logic circuit is depicted. Logic inputs X and Y are supplied to a first logic input ladder formed by transistors T1 and T7. Node0 is the summing node or evaluation node which evaluates the combination of logic input ladders when the precharge signal is set to the inactive state. Foot device T10 provides that the logic input ladders will not conduct when precharge is in the logic low state, allowing Node0 to be pre-charged. In the absence of foot device T10, Node0 would not be pre-charged and excessive current would be drawn during the pre-charge phase for certain combinations of logic inputs. Pre-charge device T11 pre-charges Node0 and when the precharge input is set to a logic low state, the combination of inputs coupled to the logic input ladders coupled to Node0 determine the logic value output by inverter INV0. The ladder formed by transistor pair T1 and T7 conducts when their gates are both in a logic high state providing a NAND function at Node0 and an AND function at the output of INV0. Similarly transistor pair T2, T8 and transistor pair T3, T9 are coupled to Node0, provided two additional NAND terms that are combined in a logical OR with the ladder formed by transistor pair T1 and T7.

Leakage from Node0 due to the floating-body effect is reduced by the addition of transistors T4, T5 and T6 to the intermediate nodes of the logic input ladders. When the precharge signal is in a logic low state, these transistors conduct and the parasitic capacitance from the source terminals of transistors T1, T2, and T3 to the respective bodies of transistors T1, T2, and T3 limits the voltage excursions that occur on the bodies of transistors T1, T2, and T3. An inverter INV1 provides the inversion of the precharge signal to enable transistors T4, T5 and T6 while the precharge signal is in a logic low state, causing the intermediate nodes of the logic input ladders to be pulled to ground potential. Pulling the intermediate nodes to ground reduces the floating-body effect, but the body of transistors T1, T2 and T3 can still rise substantially above the ground potential during the evaluate phase (when the precharge signal is in the high logic state). The lowering of the voltage on the floating body of transistors T1, T2 and T3 is accomplished by the parasitic capacitance between the sources of transistors T1, T2 and T3 and their respective bodies. When the precharge signal is in a low logic state, the momentary conduction of transistors T4, T5 and T6 removes positive charge from the bodies of transistors T1, T2 and T3.

Figure 3:
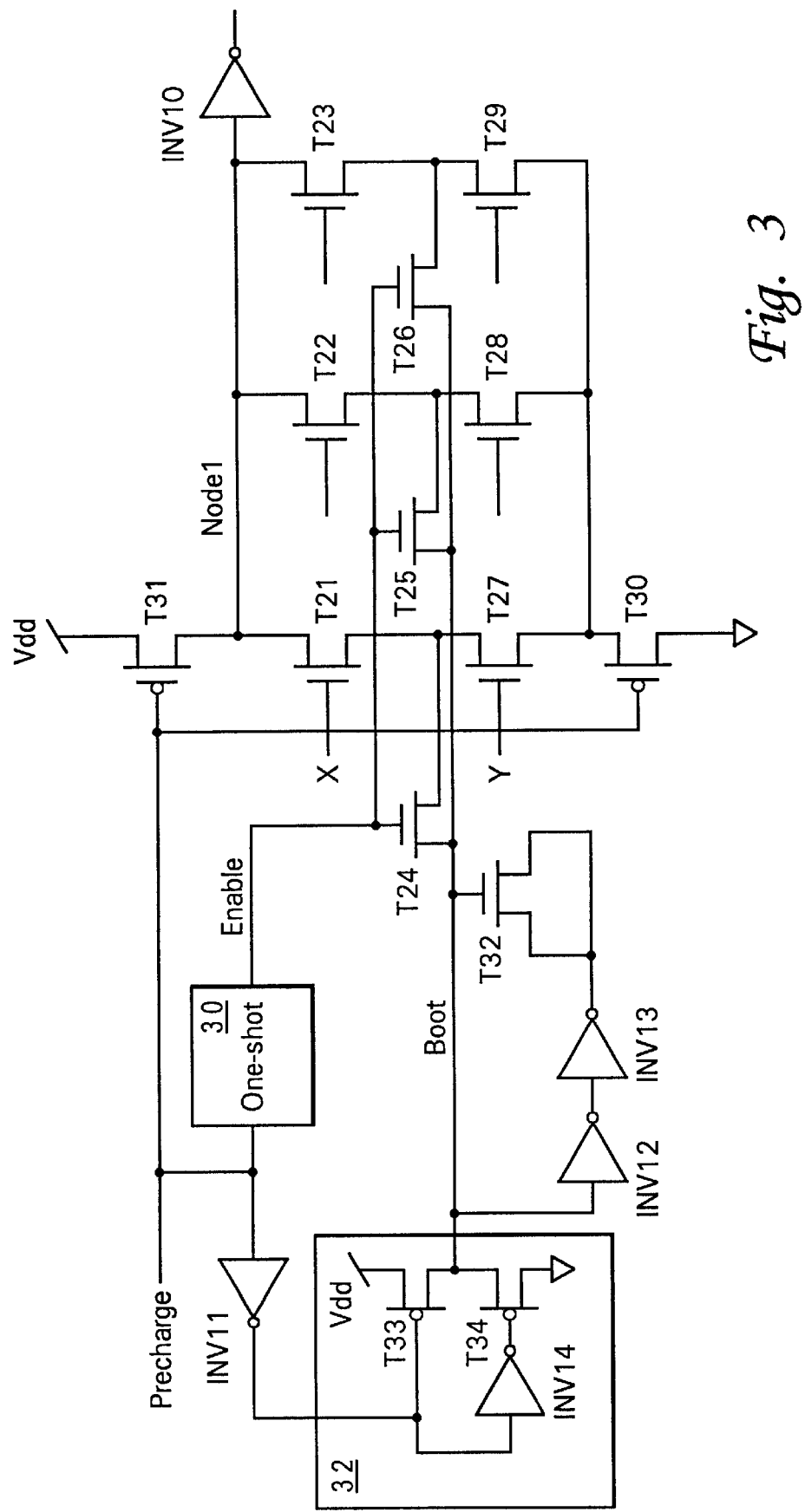
FIG. 3 is a schematic diagram of a dynamic logic circuit in accordance with an embodiment of the present invention.

Referring now to FIG. 3, an improved dynamic logic circuit is depicted, having increased noise tolerance due to further reduction of the floating-body effect. As a preferred embodiment of the present invention, a negative bias is applied to the sources of the transistors connected to intermediate nodes of the logic input ladders. The negative bias is applied during the precharge period, allowing a greater decrease of the floating-body effect than is possible with the grounding technique used in the circuit depicted in FIG. 2.

A bias generator is implemented by using a transistor T32 as a bulk capacitor to store a charge produced by the difference between a boot signal at the input of an inverter INV12 and the delayed signal from the output of an inverter INV13. A discrete capacitor can be used in place of transistor T32 if it is available in the technology. When the delay produced by inverters INV12 and INV13 has elapsed on a negative transition of the boot signal, the boot signal will be driven to a lower potential (below ground), since the output of inverter INV13 will fall to a low logic level. In order to properly drive the boot signal, a special inverter 32 is used. Inverter 32 differs from a standard static inverter in that the output stage uses similar MOS transistors (a PMOS transistor in the present embodiment) and not complementary MOS transistors. This avoids conduction when the boot signal is pulled below ground. If a standard CMOS inverter were used in place of inverter 32, the NMOS transistor would conduct from its channel if the boot signal drops below ground. In order to drive transistors T33 and T34, a complementary drive signal is produced by an inverter INV14 to drive PMOS transistor T34.

A one-shot circuit 30 is provided to apply the negative bias to bias control transistors T24, T25, and T26. Transistors T24, T25, and T26 pull the respective sources of transistors T21, T22, and T23 below ground to reduce the body voltage variation within transistors T21, T22, and T23. One-shot circuit 30 ensures that transistors T24, T25, and T26 will turn off before the boot signal voltage level rises due to the precharge signal returning to the inactive high state. One-shot circuit 30 is optimized to maintain conduction of transistors T24, T25, and T26 until the parasitic capacitances from the sources to the bodies of transistors T21, T22, and T23 have been discharged completely. It will be understood by one of ordinary skill in the art that other timing arrangements for applying the negative bias may be used. For example, it is possible to permit one-shot 30 to continue to enable bias control transistors T24, T25, and T26 after the precharge signal is deasserted without causing circuit malfunction, as long as the bias control is disabled before the boost signal rises above the negative bias level.

The capacitance of transistor T32 must be limited to a range that prevents forward-biasing the junctions of transistors T24, T25, and T26 or the junctions of transistors T21, T22, and T23. The body voltages of transistors T21, T22, and T23 is reduced by approximately $V_{boot}$·body capacitance/(body capacitance+source capacitance).

Figure 4:
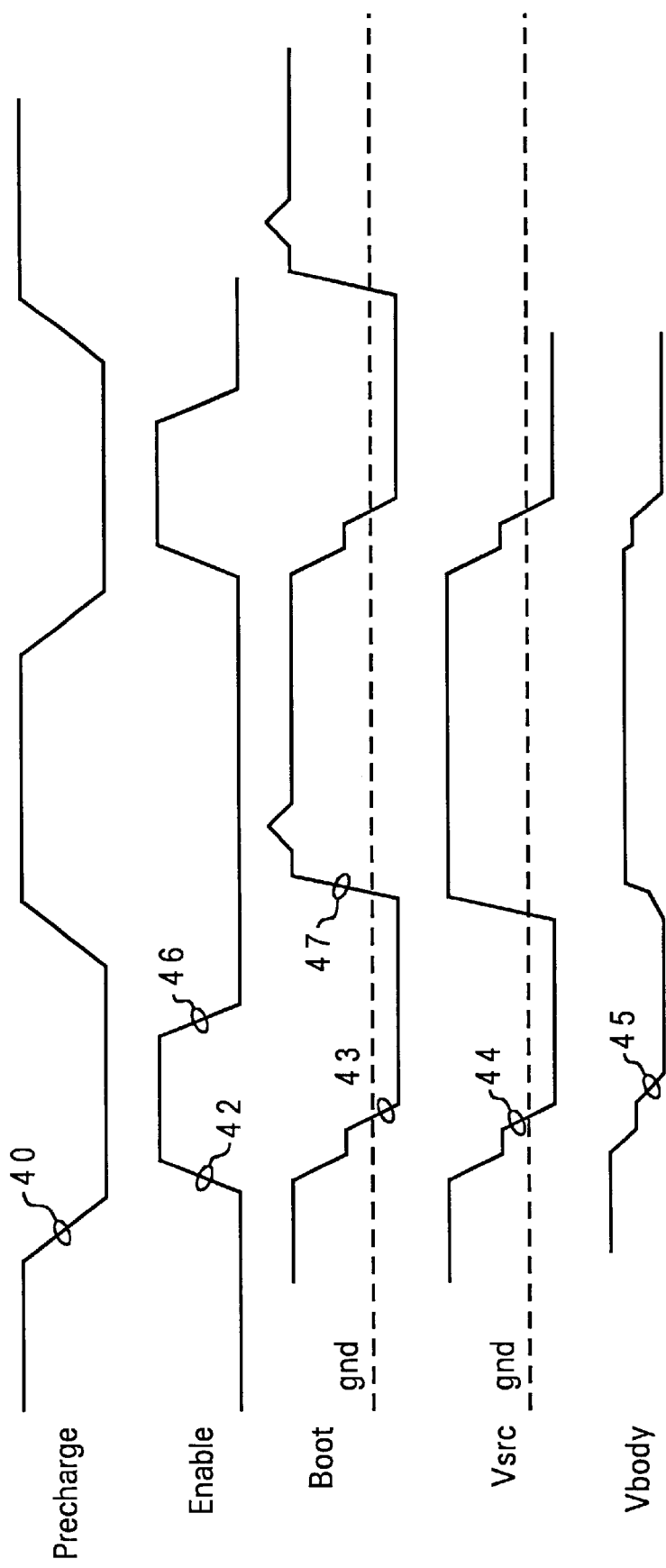
FIG. 4 is a timing diagram depicting the relationship of signals within the dynamic logic circuit of FIG. 3.

Referring now to FIG. 4, the relationship among various signals present during the operation of the circuit of FIG. 3 is depicted. When a precharge signal is set to a logic low state at transition 40, the boot signal is pulled below ground potential in transition 43. The enable signal gates the negative potential onto the intermediate nodes of the logic input ladders at transition 42 and the intermediate node voltage falls below ground ($V_{src}$) at transition 44. This lowers the voltage on the floating bodies of the input transistors coupled to Node1 ($V_{body}$) at transition 45. The average voltage of $V_{body}$ for a transistor is dependent on the voltages present on the terminals of the transistor over multiple cycles of circuit operation, since the body of the transistor is floating. Therefore $V_{body}$ is not referenced to ground in FIG. 4, but instead shows relative variation of the body voltage. The enable signal is deasserted at transition 46 before the boot signal rises above ground at transition 47, preventing a positive bias from being applied to the intermediate nodes of the logic input ladders.

While the invention has been particularly shown and described with reference to a preferred embodiment, it will be understood by those skilled in the art that various changes in form and detail may be made therein without departing from the spirit and scope of the invention. For example, the N-channel devices forming the logic ladders could be replaced by P-channel devices, and the bias generator designed to produce a positive voltage above the power supply rail, essentially reversing the voltage level operation of the circuit without changing the essential structure or method steps that characterize the invention.

What is claimed is:

1. A dynamic logic circuit, comprising:

a pre-charge transistor coupled to a pre-charge input and a summing node;

at least one logic input ladder coupled to said summing node, wherein said at least one logic input ladder includes a plurality of transistors having a floating body, wherein of said plurality of transistors has a gate coupled to a plurality of logic inputs;

a bias generator circuit coupled to said pre-charge input for generating a negative bias level; and a bias control circuit, coupled to said bias generator circuit, for applying said negative bias to intermediate nodes of said at least one logic input ladder.

2. The dynamic logic gate according to claim 1, wherein said bias control circuit applies said negative bias to intermediate nodes of said at least one logic input ladder when said pre-charge signal is active.

3. The dynamic logic gate according to claim 2, wherein said bias control circuit comprises:

a one shot coupled to said pre-charge input for producing a pulse when said pre-charge input enters an active state; and a plurality of discharge transistors each having a drain coupled to said intermediate nodes of said at least one logic input ladder, a source coupled to said bias generator circuit and a gate coupled to an output of said one shot.

4. The dynamic logic gate according to claim 1, wherein said bias control circuit comprises:

a one shot coupled to said pre-charge input for producing a pulse when said pre-charge input enters an active state; and a plurality of discharge transistors each having a drain coupled to said intermediate nodes of said at least one logic input ladder, a source coupled to said bias generator circuit and a gate coupled to an output of said one shot.

5. The dynamic logic gate according to claim 4, wherein said plurality of discharge transistors are implemented in Silicon-On-Insulator technology.

6. The dynamic logic gate according to claim 1, wherein said plurality of transistors within said at least one logic input ladder are implemented in Silicon-On-Insulator technology.

7. The dynamic logic gate according to claim 1, wherein said bias generator circuit comprises:

a bulk capacitor; and a delay circuit coupled to said bulk capacitor for shifting the voltage level at a terminal of said bulk capacitor.

8. The dynamic logic gate according to claim 7, wherein said bias generator circuit further comprises an inverter for inverting said pre-charge signal for producing an input to said delay circuit, wherein said inverter has two output transistors fabricated from P-channel material for avoiding conduction when said input to said delay circuit assumes a negative potential, and wherein said output transistors are driven by complementary logic signals.

9. The dynamic logic gate according to claim 7, wherein said delay circuits comprises a first inverter having an input coupled to a first terminal of said bulk capacitor and a second inverter having an input coupled to an output of said first inverter and an input coupled to a second terminal of said bulk capacitor.

10. The dynamic logic gate according to claim 7, wherein said bulk capacitor comprises a transistor having a source and a drain, wherein said source and drain are connected forming a first terminal of said bulk capacitor, and wherein said transistor further has a gate forming a second terminal of said bulk capacitor.

11. The dynamic logic gate according to claim 7, wherein said bulk capacitor comprises a discrete capacitor.

12. A dynamic logic gate comprising:

at least one logic input ladder coupled to a summing node;

a precharge transistor coupled to said summing node for precharging said summing node in response to a pre-charge signal;

a bias generator circuit comprising a bulk capacitor coupled to a delay circuit for generating a negative bias level;

a plurality of discharge transistors coupled to intermediate nodes of said at least one logic input ladder for applying said bias to said intermediate nodes of said at least one logic input ladder; and a one shot circuit coupled to the gates of said plurality of discharge transistors for causing said plurality of discharge transistors to conduct momentarily.

13. A method for reducing pre-charge leakage in a dynamic logic circuit having a summing node and a pre-charge input coupled to a pre-charge signal, wherein said dynamic logic circuit has a plurality of logic inputs and wherein said method comprises the steps of:

pre-charging said summing node of said dynamic logic circuit;

generating a negative bias in response to a transition of said pre-charge signal to an active state; and applying said negative bias to intermediate nodes of logic input ladders within said dynamic logic circuit, subsequent to generating said negative bias.

14. The method according to claim 13, wherein said step of applying said negative bias to intermediate nodes of logic input ladders within said dynamic logic circuit applies said negative bias while said pre-charge signal is active.

15. The method according to claim 14, wherein said dynamic logic circuit further comprises at least one logic input ladder, and said method further comprises the step of discharging said summing node through said at least one logic input ladder in conformity with a state of said plurality of logic inputs.

16. The method according to claim 13, wherein said dynamic logic circuit further comprises at least one logic input ladder, and said method further comprises the step of discharging said summing node through said at least one logic input ladder in conformity with a state of said plurality of logic inputs.

17. The method according to claim 13, wherein said dynamic logic circuit further comprises a one-shot circuit and said step of applying is performed momentarily in conformity with an output of said one-shot circuit.

18. The method according to claim 13, wherein said dynamic logic circuit further comprises a bias generator having a bulk capacitor and said step of generating comprises the steps of:

charging said bulk capacitor; and shifting the voltage level at a first terminal of said bulk capacitor responsive to said step of charging.

19. The method according to claim 13, wherein said dynamic logic circuit further comprises a bias generator having a bulk capacitor and said step of generating comprises the steps of:

charging said bulk capacitor; and shifting the voltage level at a first terminal of said bulk capacitor responsive to said step of charging.

20. The method according to claim 13, wherein said dynamic logic circuit comprises Silicon-On-Insulator transistors, and wherein said step of applying said negative bias to intermediate nodes of logic input ladders within said dynamic logic circuit causes discharge of a voltage of a body of at least one Silicon-On-Insulator transistor coupled to one of said intermediate nodes.

* * * * *